United States Patent
Ko et al.

(10) Patent No.: US 7,429,542 B2
(45) Date of Patent: Sep. 30, 2008

(54) UV TREATMENT FOR LOW-K DIELECTRIC LAYER IN DAMASCENE STRUCTURE

(75) Inventors: Chung-Chi Ko, Nantou (TW); Keng-Chu Lin, Pingtung (TW); Tien-I Bao, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 271 days.

(21) Appl. No.: 11/404,020

(22) Filed: Apr. 14, 2006

(65) Prior Publication Data

US 2007/0243720 A1    Oct. 18, 2007

(51) Int. Cl.
*H01L 21/26*    (2006.01)

(52) U.S. Cl. ...................................... 438/795

(58) Field of Classification Search ............... 438/36, 438/474, 795–798; 257/647–652
See application file for complete search history.

(56) References Cited

U.S. PATENT DOCUMENTS

| 6,319,809 | B1* | 11/2001 | Chang et al. | 438/597 |
| 2006/0286306 | A1* | 12/2006 | Ohara et al. | 427/532 |

* cited by examiner

*Primary Examiner*—Calvin Lee
(74) *Attorney, Agent, or Firm*—Birch, Stewart, Kolasch & Birch, LLP

(57) ABSTRACT

An UV treatment for making a low-k dielectric layer having improved properties in a damascene structure. A low-k dielectric layer in a damascene structure is subjected to an UV treatment with He gas or $H_2$ gas to eliminate etching damage to the exposed surfaces of the low-k dielectric layer.

15 Claims, 2 Drawing Sheets

UV TREATMENT FOR LOW-K DIELECTRIC LAYER IN DAMASCENE STRUCTURE

TECHNICAL FIELD

The present invention relates to a process in manufacturing semiconductor chips, and particularly to a method of eliminating etching damage to a low-k dielectric layer in a damascene structure.

BACKGROUND

In semiconductor manufacturing industry, new materials with low dielectric constants (known in the art as "low-k dielectrics") are being investigated for their potential use as insulators in semiconductor chip designs. A low dielectric constant material aids in enabling further reductions in integrated circuit feature dimensions. Damascene interconnect features are advantageously used to provide planarized interconnect structures that afford the use of multiple interconnect layers and therefore increase levels of device integration. There is a trend in the semiconductor industry towards the use of low-k dielectric materials, particularly used in conjunction with copper conductive lines, to reduce the RC time delay of the conductive lines. Some low-k dielectric materials are porous and/or etch very quickly, and it is difficult to adequately control the etch process, particularly in a dual damascene structure and process.

Various materials appear to be suitable for use with the damascene deposited interconnect lines, such as an ultra low-k dielectric material. However the low-k dielectric material creates problems, for example, its higher sensitivity to etchant used in formation of integrated circuit structures. This results in damage to such low-k material during the etching of openings therein for formation of vias and trenches. The etching damage can cause an increased effective dielectric constant ($k_{eff}$), degradation of the dielectric properties of the inter-metal dielectric layer, a high resistance of metal line, and disconnection (open) of copper line. One approach to solving the problems is to expose the etched surfaces (e.g., sidewall surfaces of etched via and trench of the low-k dielectric layer) to plasma formed from $H_2$ gas. This method reduces damage to the low-k dielectric layer, but disadvantageously induces higher k value due to extra ion bombardment.

Therefore, it is desirable to provide a method of eliminating etching damage to a low-k dielectric layer in a damascene structure for making the low-k dielectric layer with improved structural properties without compromising or deteriorating its electrical properties.

SUMMARY OF THE INVENTION

Embodiments of the present invention include methods of eliminating etching damage to a low-k dielectric layer in a damascene structure for improving structural properties thereof.

In one aspect, the present invention provides a method of making a low-k dielectric layer having improved properties. A low-k dielectric layer having an opening is provided overlying a semiconductor substrate, and then an UV treatment is performed on the opening of the low-k dielectric layer.

In another aspect, the present invention provides a method of making a low-k dielectric layer having improved properties in a damascene structure. A low-k dielectric layer is formed overlying a semiconductor substrate, and a damascene opening is patterned in the low-k dielectric layer. An UV treatment with He gas is then performed on the damascene opening of the low-k dielectric layer.

In another aspect, the present invention provides a method of making a low-k dielectric layer having improved properties in a damascene structure. A low-k dielectric layer is formed overlying a semiconductor substrate, and a damascene opening is patterned in the low-k dielectric layer. An UV treatment with $H_2$ gas is then performed on the damascene opening of the low-k dielectric layer.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
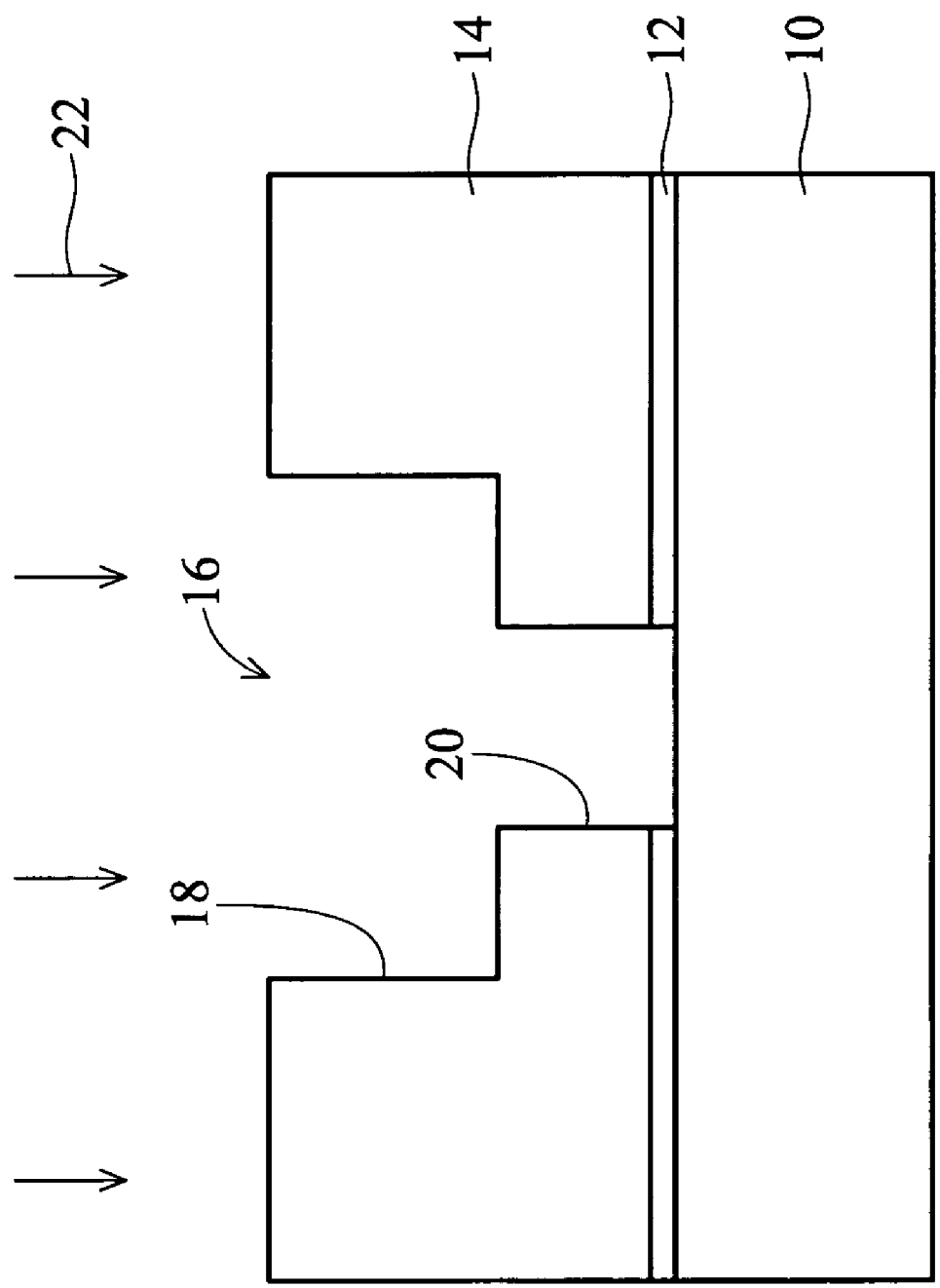
FIG. 1 is a cross-sectional diagram illustrating an exemplary embodiment of an UV treatment on a low-k dielectric layer in a damascene structure.

Embodiments of the present invention provide methods of eliminating etching damage to a low-k dielectric layer in a damascene structure for improving structural properties thereof. The improved properties include decreased dielectric constant (e.g., effective dielectric constant, $K_{eff}$), increased mechanical strength (e.g., improved elastic modulus and film hardness), and lower resistance of metal lines that will be subsequently formed in the damascene structure. The embodiments are equally applicable to single damascene structures, dual damascene structures, copper via step structures, and copper dual damascene structures. Particularly, the etched surface (e.g., exposed surfaces of etched via and trench) of the low-k dielectric layer is subjected to an UV (ultraviolet radiation) treatment with He or $H_2$, which can eliminate etching damage to the low-k dielectric layer more efficiently and clean the process chamber with reduced clean time as well. The UV treatment on the low-k dielectric layer is carried out after the formation of the via and/or trench.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, a cross-sectional diagram of FIG. 1 illustrates an exemplary embodiment of an UV treatment on a low-k dielectric layer in a damascene structure.

An example of a substrate 10 used for interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. The integrated circuits as used herein refer to electronic circuits having multiple individual circuit elements, such as transistors, diodes, resistors, capacitors, inductors, and other active and passive semiconductor devices. A portion of conductive routes may be exposed on the substrate. Suitable materials for the conductive routes may include, but are not limited to, for example copper, aluminum, copper-based alloy, or other mobile conductive materials.

An etch stop layer 12 deposited on the substrate 10 may be formed of silicon oxide, silicon nitride, silicon carbide, silicon oxynitride or combinations thereof, with a thickness of about 10 angstroms to about 1000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

An inter-layer-dielectric (ILD) layer 14 formed on the etch stop layer 12 reaches a thickness of about 500 angstroms to about 30000 angstroms through any of a variety of techniques, including, spin coating, CVD, and future-developed deposition procedures. The ILD layer 14 may be a single layer or a multi-layered structure (with or without an intermediate etch stop layer). The ILD layer 14 is formed of a low-k dielectric layer. As used throughout this disclosure, the low-k dielectric layer includes a low-k dielectric material, an extreme low-k dielectric material, a porous low-k dielectric layer, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments of the present invention, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, porous organic series material, polyimides, polysilsesquioxanes, polyarylethers, fluorosilicate glass, and commercial materials such as FLARE from Allied Signal, or SiLK from Dow Corning, and other low-k dielectric compositions. Suitable examples of extreme low-k materials may include the SiLK™ manufactured by the Dow Chemical Company of Midland, Mich., or an "organosilcate" material such as ORION™ manufactured by the Trikon Company of Newport in the United Kingdom, porous MSQ films and various florocarbonated silicon films. For a material such as ORION™ a precursor such as methysilane and hydrogen peroxide. As an example, a material such as Tri-methyl silane from Applied Materials of Santa Clara, Calif., may also be used.

A dual damascene opening 16 including an upper trench section 18 and a lower via hole section 20 is patterned in the ILD layer 14 to define a contact region on the substrate 10. Although the embodiment of the present invention illustrate a dual damascene opening in the ILD layer, the present invention provides value when using single damascene opening in the ILD layer. In dual damascene techniques including a "via-first" patterning method or a "trench-first" patterning method, the upper trench section 18 and the lower via hole section 20 may be formed using a typical lithographic with masking technologies and anisotropic etch operation (e.g. plasma etching or reactive ion etching). A bottom etch stop layer, a middle etch stop layer, a polish stop layer, or an anti-reflective coating (ARC) layer may be optionally deposited on or intermediately in the ILD layer 14, providing a clear indicator of when to end a particular etching process.

After the formation of the dual damascene opening 16, the ILD layer 14 is subjected to an UV (ultraviolet radiation) treatment 22 with He gas or $H_2$ gas to eliminate etching damage to the exposed surfaces of the upper trench section 18 and the lower via hole section 20 of the low-k dielectric material. This can reduce the effective dielectric constant of the ILD layer 14 and/or further increase the hardness and elastic modulus of the ILD layer 14 without compromising or deteriorating its electrical properties. After the UV treatment, the effective dielectric constant is reduced to reach 2.4~3.0, and the film hardness is increased to reach 1~2 Gpa by experiments. In the UV treatment, for example, the temperature is controlled ranging from about 100° C. to about 500° C., the process pressure is from about 2 Torr to about 10 Torr, and the time ranges from about 0.1 minutes to about 20 minutes. In one embodiment, the UV treatment with the gas of He can eliminate most of the damaged portions of the low-k dielectric material. In one embodiment, the UV treatment with the gas of $H_2$ can eliminate the damaged portions of the low-k dielectric material more efficiently and clean the process chamber with reduced clean time.

Figure 2B:
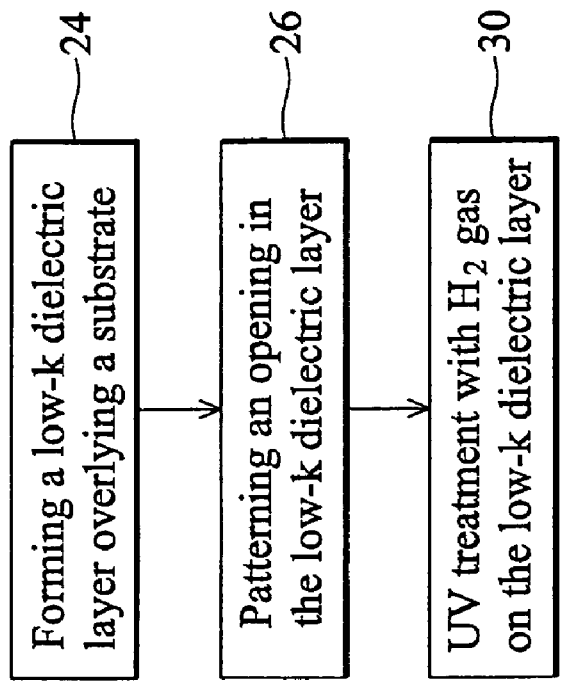
FIG. 2B illustrates the process steps in accordance with another embodiment of the present invention.
Figure 2A:
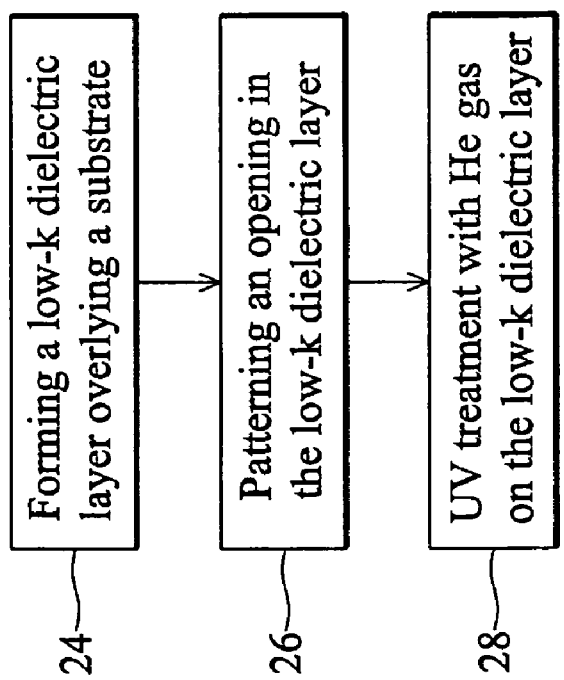
FIG. 2A illustrates the process steps in accordance with one embodiment of the present invention.

FIG. 2A illustrates the process steps in accordance with one embodiment of the present invention. As shown in step 24, the substrate 10 is provided with the low-k dielectric layer 14 formed thereon. Then, as shown in step 26, the low-k dielectric layer 14 is patterned by photolithography, masking and etching processes to form an opening therein, such as a damascene opening including the via and/or the trench. The low-k dielectric layer 14 is then treated by the UV treatment 22 with He gas as shown in step 28 so as to eliminate etching damage to the etched surface of the low-k dielectric layer 14 and further improve its structural properties. Similarly, FIG. 2B illustrates the process steps in accordance with another embodiment of the present invention. As shown in step 24, the substrate 10 is, provided with the low-k dielectric layer 14 formed thereon. Then, as shown in step 26, the low-k dielectric layer 14 is patterned by photolithography, masking and etching processes to form an opening therein, such as a damascene opening including the via and/or the trench. The low-k dielectric layer 14 is then treated by the UV treatment 22 with $H_2$ gas as shown in step 30 so as to eliminate etching damage to the etched surface of the low-k dielectric layer 14 and further improve its structural properties. This step 30 can also clean the process chamber with reduced clean time.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of making a low-k dielectric layer having improved properties, comprising:
    providing a low-k dielectric layer overlying a semiconductor substrate;
    forming an opening in said low-k dielectric layer; and
    performing an UV treatment on said opening of said low-k dielectric layer;

wherein said low-k dielectric layer has an effective dielectric constant of from 3.0 to 2.4 after performing said UV treatment.

2. The method of claim 1, wherein the step of performing an UV treatment uses He gas.

3. The method of claim 1, wherein the step of performing an UV treatment uses $H_2$ gas.

4. The method of claim 1, wherein said low-k dielectric layer has a dielectric constant of about 3.0 or less before performing said UV treatment.

5. The method of claim 1, wherein said low-k dielectric layer has a dielectric constant of about 2.5 or less before performing said UV treatment.

6. The method of claim 1, wherein said low-k dielectric layer has a film hardness greater than 1.0 after performing said UV treatment.

7. The method of claim 1, wherein said opening in said low-k dielectric layer is a damascene opening exposing a portion of said semiconductor substrate.

8. A method of making a low-k dielectric layer having improved properties in a damascene structure, comprising:
    providing a low-k dielectric layer overlying a semiconductor substrate;
    forming a damascene opening in said low-k dielectric layer; and
    performing an UV treatment with He gas on said damascene opening of said low-k dielectric layer;
    wherein said low-k dielectric layer has an effective dielectric constant of from 3.0 to 2.4 after performing said UV treatment with He gas.

9. The method of claim 8, wherein said low-k dielectric layer has a dielectric constant of about 3.0 or less before performing said UV treatment with He gas.

10. The method of claim 8, wherein s said low-k dielectric layer has a dielectric constant of about 2.5 or less before performing said UV treatment with He gas.

11. The method of claim 8, wherein said low-k dielectric layer has a film hardness greater than 1.0 after performing said UV treatment with He gas.

12. A method of making a low-k dielectric layer having improved properties in a damascene structure, comprising:
    providing a low-k dielectric layer overlying a semiconductor substrate;
    forming a damascene opening in said low-k dielectric layer; and
    performing an UV treatment with $H_2$ gas on said damascene opening of said low-k dielectric layer;
    wherein said low-k dielectric layer has an effective dielectric constant of from 3.0 to 2.4 after performing said UV treatment with $H_2$ gas.

13. The method of claim 12, wherein said low-k dielectric layer has a dielectric constant of about 3.0 or less before performing said UV treatment with $H_2$ gas.

14. The method of claim 12, wherein s said low-k dielectric layer has a dielectric constant of about 2.5 or less before performing said UV treatment with $H_2$ gas.

15. The method of claim 12, wherein said low-k dielectric layer has a film hardness greater than 1.0 after performing said UV treatment with $H_2$ gas.

* * * * *